United States Patent [19]

Peier et al.

[11] Patent Number: 5,237,265

[45] Date of Patent: Aug. 17, 1993

[54] FIBER OPTICS ARRANGEMENT FOR MEASURING THE INTENSITY OF AN ELECTRIC CURRENT

[75] Inventors: Dirk Peier, Dortmund; Holger Hirsch, Bönen, Fed. Rep. of Germany

[73] Assignee: MWB Messwandler-Bau A.G., Bamberg, Fed. Rep. of Germany

[21] Appl. No.: 828,955

[22] PCT Filed: Jul. 12, 1990

[86] PCT No.: PCT/DE90/00530

§ 371 Date: Feb. 5, 1992

§ 102(e) Date: Feb. 5, 1992

[87] PCT Pub. No.: WO91/01500

PCT Pub. Date: Feb. 7, 1991

[30] Foreign Application Priority Data

Jul. 19, 1989 [DE] Fed. Rep. of Germany ....... 3923803

[51] Int. Cl.$^5$ .............................. F01R 31/00
[52] U.S. Cl. ................. 324/96; 324/117 R; 324/158 R
[58] Field of Search .............. 324/96, 117 R, 244, 324/244.1, 158 R; 356/350, 368; 359/245; 250/227.17

[56] References Cited

U.S. PATENT DOCUMENTS

| | | | |
|---|---|---|---|
| 4,070,622 | 1/1978 | Harms et al. | 324/96 |
| 4,370,612 | 1/1983 | Peuch et al. | 324/96 |
| 4,563,639 | 1/1986 | Langeac | 324/96 |
| 4,604,577 | 8/1986 | Matsumura et al. | 324/244.1 |
| 4,797,607 | 1/1989 | Dupraz | 324/96 |
| 5,051,577 | 9/1991 | Lutz et al. | 324/96 |

FOREIGN PATENT DOCUMENTS 2104231 3/1983 United Kingdom .
2164146 3/1986 United Kingdom .

OTHER PUBLICATIONS

Rogers; "Optical fibre current Measurement"; International Journal of Optoelectronics, 1988, vol. 3, No. 5, pp. 391–407.
Patent Abstract of Japan vol. II No. 399 p. 651—Abstract JP 62-161059 pub. Jul. 17, 1987.
Patent Abstract of Japan vol. 8 No. 137 p. 282—Abstract JP 59-38663 pub. Mar. 2, 1984.
Patent Abstract of Japan vol. 10 No. 288 p. 502—Abstract JP 61-107169 pub. May 26, 1986.

Primary Examiner—Vinh Nguyen
Attorney, Agent, or Firm—Barnes & Thornburg

[57] ABSTRACT

Figure 1:
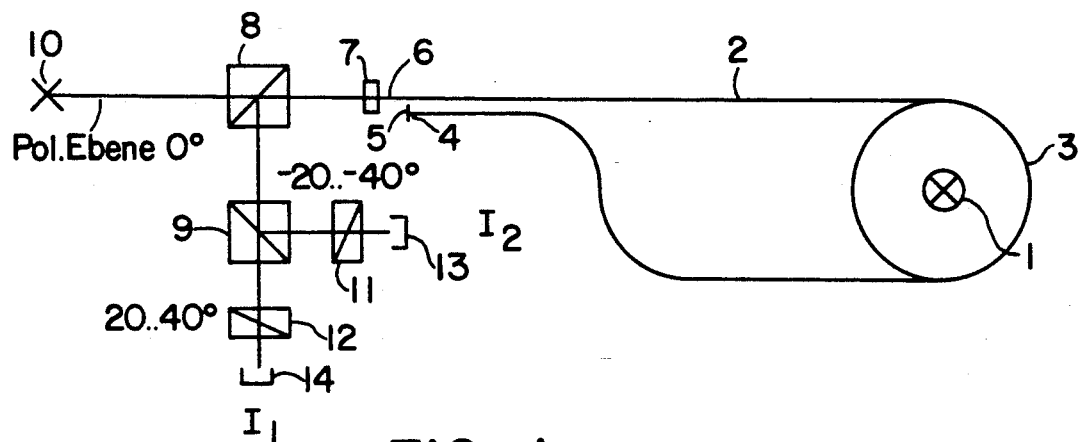

In the case of a fiber optics arrangement for measuring the intensity of an electric current while utilizing the Faraday effect in which the magnetic field surrounding the conductor 1 through which the current flows affects the polarization condition of the light, the path of which leads through the core of an optical fiber 2 which surrounds the conductor 1 in the form of a coil, the light coupled out of the optical fiber 2, by means of a beam splitter 9, being divided into two partial light beams, the intensities ($I_1$, $I_2$), after passage through one polarizer 12, 11 respectively, being measured by one photodetector 14, 13 respectively, the object of expanding the measuring range of the arrangement is achieved by the fact that the polarizers 12, 11 are rotated symmetrically with respect to one another in comparison to the conventional angle of 45 degrees, the angle ($\alpha$) between the polarizers 12, 11 and the polarization plane of the light coupled into the optical fiber 2 being between +20 degrees and 40 degrees or between −20 degrees and −40 degrees. (FIG. 1)

4 Claims, 1 Drawing Sheet

FIBER OPTICS ARRANGEMENT FOR MEASURING THE INTENSITY OF AN ELECTRIC CURRENT

The invention relates to a fiber optics arrangement for measuring the intensity of an electric current while utilizing the Faraday effect, the magnetic field, which surrounds the conductor through which the current flows, influencing the polarization condition of the light, the path of which leads through the core of an optical fiber which surrounds the conductor in the form of a coil, the light, which is coupled out of the optical fiber, being divided by a beam splitter into two partial light beams, the intensities of which, after passing through one polarizer respectively, being measured by one photodetector respectively.

Arrangements of this type are used particularly in high-voltage systems for measuring currents in lines on a high-voltage potential. Since the beam waveguides consist of glass of which it is known that it is a good electric insulator, no problems exist concerning the insulation of the indicating apparatuses connected with the earth potential with respect to the conductors disposed at the high-voltage potential the current of which is to be measured and indicated.

This type of an arrangement is known from the DE-AS 22 61 151 in which light from a light source is guided through a polarizer to a semitransparent plate. From there, the polarized light arrives in an optical fiber (called "beam waveguide" there) which is partially wound into a coil, a high-voltage conductor extending in its axis and the current to be measured flowing in this conductor. At its end, this fiber coil is provided with a metallized surface, and a mirror is arranged there. The polarized light passes through the whole optical fiber, a rotation of the polarization plane taking place inside the coil-shaped part of the fiber as a result of the Faraday effect as a function of the magnetic field which the current generates which flows in the conductor. At the end of the coil, the light beam is reflected and passes through the coil again in which case another rotation of the polarization plane occurs. The light which is rotated in its polarization plane emerges from the optical fiber, penetrates the semitransparent plate and arrives in an analyzing device which determines and indicates the angle between the polarization plane of the light entering into the optical fiber and the polarization plane of the light emerging from the fiber, in which case the size of this angle is proportional to the path integral above the magnetic field strength.

From the DE-AS 28 35 794, a fiber optics arrangement for the measuring of the intensity of an electric current by utilizing the Faraday effect is also known in which the magnetic field surrounding the conductor through which the current flows influences the polarization condition of the light, the path of which leads through the core of an optical fiber which surrounds the conductor in the form of a coil. In contrast to the DE-AS 22 61 151, in the case of this arrangement, no reflecting surface is provided at the one end of the fiber, but the light is coupled in at the one end and is coupled out again at the other end, in which case the coil wound from the optical fiber must have twice the number of windings in order to obtain the same angle of rotation of the polarization plane because the light passes through the coil only once.

In both above-explained cases, the analyzing device consists of a beam splitter which divides the coupled-out light into two partial light beams, the polarization planes of which, after passing through two polarizers which a oriented perpendicularly with respect to one another, stand perpendicularly on one another, and the intensities of which are measured by means of two photodetectors, the photocurrents of which will then be $$I_1 I_0 \cdot (1 + \sin 2\theta)$$

and $$I_2 = I_0 = (1 - \sin 2\theta)$$

wherein the angle $\theta$ according to $$\theta = V.N.I$$

is proportional. The number of windings of the optical fiber around the current-carrying conductor is N. The material-dependent proportionality constant is indicated by $$V = 2.6 \cdot 10^{-6} \, rad/A$$

From the two photocurrents, according to $$U_A = \frac{I_1 - I_2}{I_1 + I_2} = \sin 2\theta = \sin 2 \cdot V \cdot N \cdot I$$

the output signal $U_A$ is then obtained which is a sinusoidal function of the current to be measured.

In order to keep expenditures low for the calculations which have to take place in real-time, the sensor is dimensioned such that the current-dependent angle $\theta$ remains small. Then the sine function may be proximated linearly because the sine of a small angle is approximately equal to this angle.

In addition, very large currents, such as short-circuit currents which cause a rotation of the polarization plane of the light by more than 45 degrees cannot be detected by means of the described processes because the sine function is reversibly clear only within the angular range of from $-90$ degrees to $+90$ degrees. For this reason, for example, in a known process according to the DE-AS 25 41 072, by means of a separate compensating coil and a control loop, the rotation of the polarization plane is cancelled again. As a result of an unavoidable adjusting value restriction of the current end phases, the dynamics and the bandwidth are very small. In addition, the high energy consumption of these end phases speaks against the use of this concept.

It is an object of the invention to provide a fiber optics arrangement of the initially mentioned type which permits the detecting of an enlarged current range without any increased energy consumption.

According to the characterizing part of claim 1, this object is achieved in that the polarizers are rotated symmetrically without respect to one another in comparison to the conventional angle of 45 degrees.

According to an advantageous further development of the invention, the angle between the polarizers and the polarization plane of the light coupled into the optical fiber is selected to be between $+20$ degrees and $+40$ degrees or between $-20$ degrees and $-40$ degrees.

The advantages achieved by means of the invention are particularly that the linear proximation of the output voltage $U_A$ is valid for significantly larger rotations of the polarization plane. As a result, the dynamics are enlarged in comparison to the analysis in the known arrangements. By means of the additional computer-supported analysis which directly detects the photocurrents $I_1$ and $I_2$, a rotation of the polarization plane of above 45 degrees can still be detected.

An embodiment is shown in the drawing and will be described in detail in the following.

Figure 2:
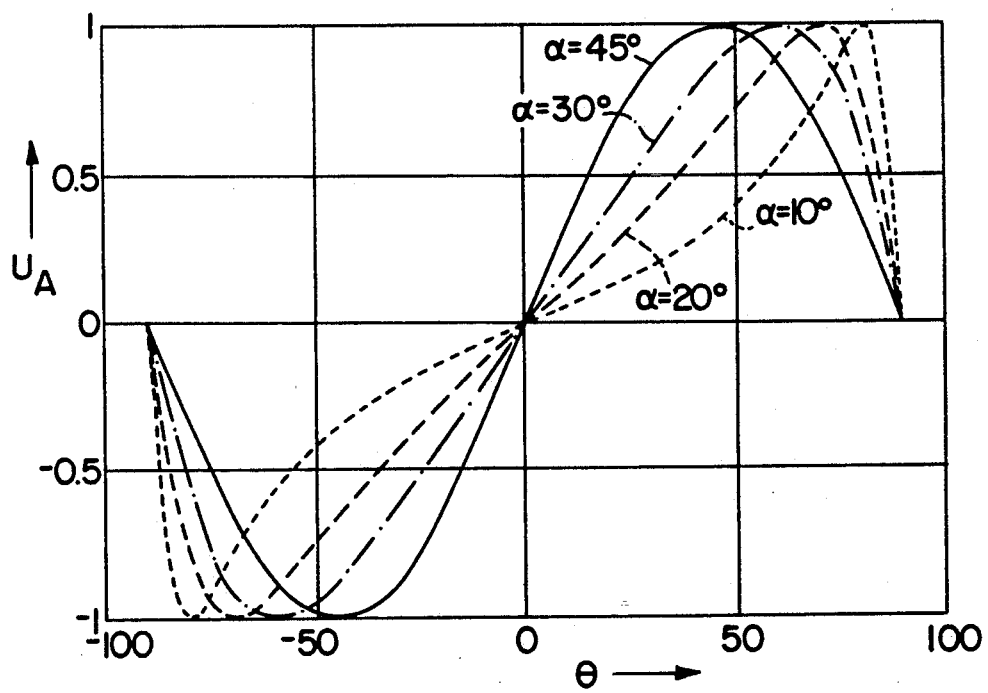

FIG. 1 is a view of the schematic construction of the arrangement according to the invention; and FIG. 2 is a representation of the function of the output signal of an analyzing device of the arrangement according to the invention as a function of the angle of rotation $\theta$ of the polarization plane.

The fiber optics arrangement according to FIG. 1 for measuring the intensity of an electric current comprises an optical fiber 2 which extends from its one end 6, which is arranged at a lens 7, to a conductor 1 disposed on a high-voltage potential, and which surrounds this conductor 1 as a coil 3 by means of a number of windings arranged next to one another and extends back into the proximity of the lens 7 where its end 4 has a metallized surface which is aligned at a right angle with respect to the longitudinal axis of the fiber.

The lens 7 couples the polarized light which is emitted by a laser 10 and arrives by way of a beam splitter 8 into one end 6 of the optical fiber 2. Inside the part of the optical fiber 2 which is formed into a coil 3, the beam waveguide is exposed to a magnetic field which is generated by the current flowing through the conductor 1. As a result of the Faraday effect, the polarization plane of the guided light is rotated while it passes through the coil 3 and thus through the magnetic field, the size of the angle of rotation being a measurement of the path integral above the magnetic field strength.

Behind the coil 3, the light, further by way of the optical fiber, arrives at its other end 4 where it is reflected at the metallized end face 5 so that it travels along the path through the optical fiber 2 and through the magnetic field in the area of the coil 3 in the opposite direction, in which case the polarization plane is rotated again so that the angle of rotation of the polarization plane when the light arrives at the lens 7, on the whole, is doubled in comparison to the angle of rotation when the light arrives at the metallized end face 5.

The coupling-in and coupling-out of the light takes place by way of the lens 7. During the coupling-out, the light, from the optical fiber 2, by way of the beam splitter 8, arrives at an analyzing device which comprises another beam splitter 9, two polarizers 11, 12 and two photodetectors 13, 14 and in which the angle of rotation is determined which the polarization plane of the light has experienced when it passed through the optical fiber 2 and which is a measurement for the intensity of the electric current flowing in the conductor 1.

The polarizers 11, 12 are rotated symmetrically with respect to one another in comparison to the conventional angle of 45 degrees, specifically in such a manner that the angle between the polarizers 11, 12 and the polarization plane of the lilght coupled into the optical fiber 2 is between +20 degrees and +40 degrees or between −20 degrees and −40 degrees means of this polarization angle $\alpha$ the photocurrents are $$I_1 = I_0 \cdot (1 + \cos(2\theta + 2\alpha))$$

and $$I_2 = I_0 \cdot (1 + \cos(2\theta - 2\alpha)).$$

The output signal $U_A$ is determined in the above-mentioned manner from the photocurrents. The result are the curves in FIG. 2 which represent the output signal $U_A$ as a function of the angle of rotation $\theta$ of the polarization plane for different angular positions $\alpha$ of the polarizers 11, 12. As shown in FIG. 2, the dependence of the output signal $U_A$ on the rotation $\theta$ of the polarization plane which is proportional to the current to be measured in the case of polarizer angles $\alpha$ between 20 degrees and 40 degrees, is largely linearized. The linear proximation of the output signal $U_A$ is valid for significantly larger rotations of the polarization plane. As a result, the dynamics are increased in comparison to conventional analysis. By means of an additional computer-assisted analysis, which directly takes in the photocurrents $I_1$ and $I_2$, a rotation of the polarization plane of over 45 degrees can also still be detected.

We claim:

1. A fiber optic arrangement for measuring the intensity of an electric current in a conductor using the Faraday effect including an optical fiber coiled about said conductor, a source of light for said optical fiber, beam splitter for dividing the light out of said optical fiber into two partial light beams and further comprising:
   a pair of photo detectors;
   a pair of polarizers, one of each located between said beam splitter and a respective photo detector; and
   said polarizers having symmetrical angles between their polarization planes and the polarization plane of the light coupled into said optical fiber and said symmetrical angles being acute.

2. A fiber optic arrangement according to claim 1, wherein said symmetrical angles are between +20 degrees and +40 degrees or between −20 degrees and −40 degrees.

3. A fiber optic arrangement according to claim 1 wherein said symmetrical angles extend the ability of said arrangement to detect when rotation of the polarization plane of said light coupled into said fiber optic is greater than 45 degrees.

4. A fiber optic arrangement for measuring the intensity of an electric current in a conductor using the Faraday effect including an optical fiber coiled about said conductor, a source of light for said optical fiber, beam splitter for dividing the light out of said optical fiber into two partial light beams and further comprising:
   a pair of photo detectors;
   a pair of polarizers, one of each located between said beam splitter and a respective photo detector;
   said polarizers having symmetrical angles between their polarization plane and the polarization plane of the light coupled into said optical fiber which extend the linearity of the photo detectors to greater than 45° of rotation of the polarization plane of said light coupled into said optical fiber.

* * * * *